United States Patent [19]
Redl et al.

[11] Patent Number: 5,198,969
[45] Date of Patent: Mar. 30, 1993

[54] SOFT-SWITCHING FULL-BRIDGE DC/DC CONVERTING

[75] Inventors: Richard Redl, Fribourg, Switzerland; Laszlo Balogh, Lexington, Mass.

[73] Assignee: Design Automation, Inc., Lexington, Mass.

[21] Appl. No.: 821,324

[22] Filed: Jan. 13, 1992

Related U.S. Application Data

[63] Continuation of Ser. No. 553,457, Jul. 13, 1990, abandoned.

[51] Int. Cl.$^5$ .............................. H02M 3/335
[52] U.S. Cl. ........................ 363/17; 363/58; 363/98; 363/132
[58] Field of Search .................. 363/17, 56, 98, 132, 363/58

[56] References Cited

U.S. PATENT DOCUMENTS

| | | | |
|---|---|---|---|
| 3,859,587 | 1/1975 | Brown | 321/45 C |
| 4,191,993 | 5/1980 | Kratz | 363/135 |
| 4,276,588 | 6/1981 | McLyman | 363/56 |
| 4,410,935 | 10/1983 | Dang | 363/98 |
| 4,455,599 | 6/1984 | Tamura | 363/138 |
| 4,482,946 | 11/1984 | Bhagwat | 363/136 |
| 4,502,085 | 2/1985 | Morrison | 363/56 |
| 4,661,897 | 4/1987 | Pitel | 363/17 |
| 4,855,888 | 8/1989 | Henze et al. | 363/132 |
| 4,922,401 | 5/1990 | Lipman | 363/58 |

*Primary Examiner*—Steven L. Stephan
*Assistant Examiner*—Adolf Berhane
*Attorney, Agent, or Firm*—Fish & Richardson

[57] ABSTRACT

The addition of an external commutating inductor and two clamp diodes to the phase-shifted PWM full-bridge dc/dc converter substantially reduces the switching losses of the transistors and the rectifier diodes, under all loading conditions. We give analyses, practical design considerations, and experimental results for a 1.5-kW converter with 60-V, 25-A output, operating at 100-kHz clock frequency and 95% efficiency.

1 Claim, 9 Drawing Sheets

SOFT-SWITCHING FULL-BRIDGE DC/DC CONVERTING

This is a continuation of application Ser. No. 553457 filed Jul. 13, 1990, now abandoned.

The present invention relates in general to softswitching full-bridge dc/dc converting. The switching losses in dc/dc converters can be reduced by using snubbers, or quasi-resonant or fully resonant circuits, or soft-switching circuits. Soft-switching is preferred because of these advantages:

- simpler control circuits
- simpler power circuit
- simpler analysis
- better exploitation of the power transistors and rectifier diodes
- high efficiency
- low EMI.

At power levels high enough to justify the use of four controlled switches, probably the best choice is the full-bridge soft-switching forward converter [1]-[3], [9], [10]. That converter is controlled by phase-shifted (four-state) PWM, as opposed to the parent circuit, the full-bridge forward converter with traditional (i.e., three-state) PWM.

The dynamic losses of the controlled switches in the full-bridge soft-switching converter are much smaller than in the parent circuit. However, the switching losses of the rectifier diodes are not diminished appreciably. The interaction of the reverse-recovery process of the rectifier with the leakage inductance of the transformer causes voltage overshoot and ringing That can lead to excessive dynamic losses, EMI, or failure of the rectifier. The severity of the problem increases with increasing rectifier breakdown-voltage rating (needed for increasing output voltage), because the diode reverse recovery time increases with increasing voltage rating.

The voltage overshoot can be controlled by using soft-recovery rectifiers which have low di/dt during the current-fall section of the rectifier reverse recovery. A clamp can also be used for this purpose, e.g., as shown in [3] and [10]. In addition, RC snubbers connected across the rectifiers can reduce the ringing and can steer part of the switching losses to external resistors. Unfortunately all of the above are relatively inefficient and/or complex solutions to the problem. A simpler and more efficient solution would be desirable.

Other features and advantages will become apparent from the following detailed description when read in connection with the accompanying drawings in which.

Figure 1:
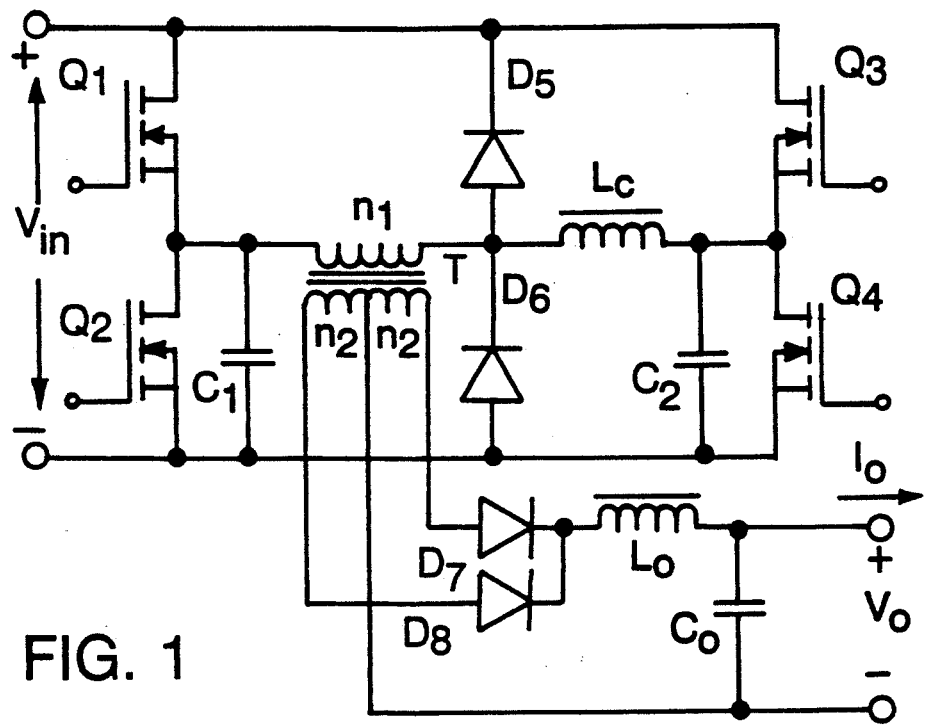
FIG. 1 shows an improved circuit according to the invention.

FIG. 1 shows such an improved circuit. By connecting a small external inductor $L_c$ in series with the primary winding of the power transformer and adding two low-current current clamp diodes $D_5$ and $D_6$, we can reduce substantially the switching losses and voltage stresses of the rectifier diodes. The inductor $L_c$ also helps the soft switching of the transistors. We call $L_c$ the "commutating inductor."

This detailed description discusses:

(1) the operating states and switch transitions of the converter, (2) the conditions for ensuring lossless transitions at nominal load, at overload, and at zero load, (3) the effect of the commutating inductor and the clamp diodes on the operation of the converter, (4) practical considerations regarding control method, current sensing, gate-drive circuit, control and protection circuit, and (5) experimental results for a 1.5 kW current-mode-controlled dc/dc converter (25 A at 60 V), operating at 100-kHz clock frequency and 50-kHz switching frequency, and having an efficiency exceeding 95%.

Figure 2:
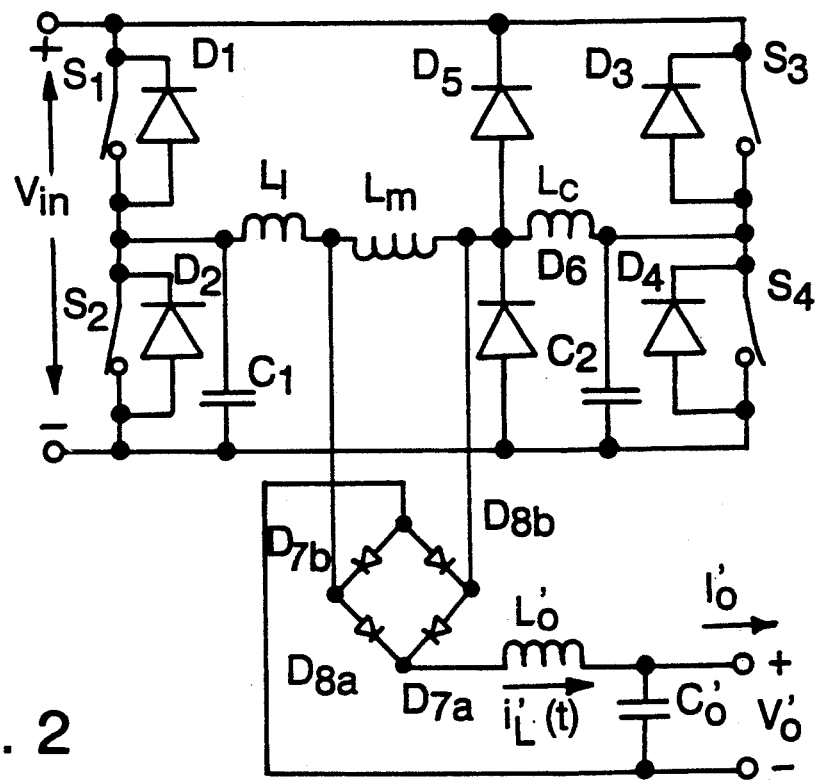
FIG. 2 shows the equivalent circuit of the converter.
Figure 3A:
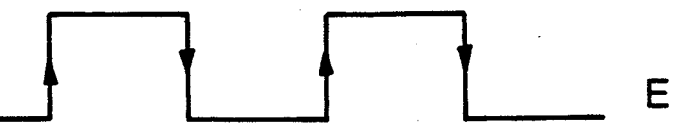
FIG. 3A-3D shows waveforms illustrating the converter states and switch transitions.
Figure 3B:
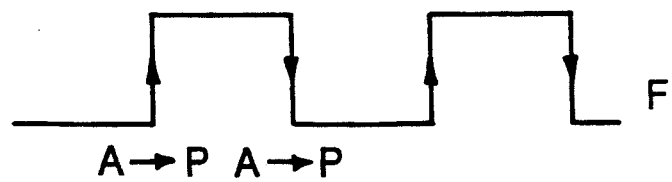
Figure 3C:
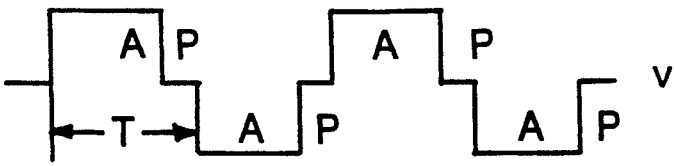
Figure 3D:

FIG. 2 shows an equivalent circuit of the converter where the load network is transformed to the primary side of the power transformer T. $C_1$ and $C_2$ represent the sum of the stray and snubbing capacitors at the two poles of the bridge. $L_1$ is the leakage inductance and $L_m$ is the magnetizing inductance of the transformer.

The converter has four states, determined by the four allowed on/off combinations of the switches. The states in which two diagonally opposite switches are conducting (e.g., $S_1$ and $S_4$ or $S_2$ and $S_3$) are called active. The states in which two switches on the same side of the power bus are conducting are called passive. Substantial energy flows in the converter only during the active state.

The two legs of the bridge ($S_1$-$S_2$ and $S_3$-$S_4$) operate under significantly different conditions. The switching of one of the legs moves the converter from the active to the passive state. The switching of the other leg moves the converter from the passive to the active state. The leg which switches only from active to passive state is called the leading leg, because the active state leads in the switching process. The other leg, which switches only from passive to active state, is the trailing leg. FIG. 3 illustrates the operation of the converter by showing some of the fundamental waveforms.

Figure 4:
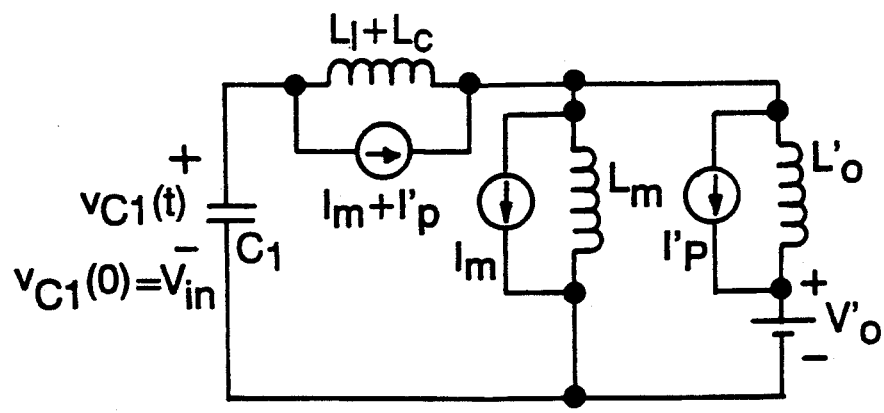
FIG. 4 shows an equivalent circuit for calculating the leading leg transition.

1. Leading-Leg (Active-to-Passive) Transitions: FIG. 4 shows the equivalent circuit, which is used for determining the voltage-transition process of the leading leg. Here we assume that (a) the leading leg comprises the switch and diode combinations $S_1$-$D_1$ and $S_2$-$D_2$, (b) the transition starts with the opening of $S_1$, (c) the elements in the circuit are ideal (i.e., lossless and linear), and (d) the current $i_L(t)$ in the output filter inductance stays above zero during the transition. (The equivalent circuit of FIG. 4 is valid only if assumption (d) holds.) $I_m$ is the peak value of the magnetizing current, $I_p'$ is the peak value of the transformed filter-inductor current $i_L'(t)$, $V_o'$ is the transformed output voltage, and vci(t) is the voltage across $C_1$ (the leg voltage).

A simple calculation results in the following time function for $v_{c1}(t)$:

$$v_{C1}(t) = V_o' \frac{L_m}{L_m + L_o'} (1 - \cos \Omega t) - \qquad (1)$$

$$(I_m + I_p') \sqrt{\frac{L_1 + L_c + L_m \| \| L_o'}{C_1}} \sin \Omega t + V_{in} \cos \Omega t,$$

where $$\Omega = \frac{1}{\sqrt{(L_1 + L_c + L_m \| \| L_o')C_1}}. \qquad (2)$$

We can obtain the time function of the leg voltage for a transition starting with the opening of $S_2$ instead of $S_1$ simply as $$V_{c1}(t)' = V_{in} - v_{c1}(t). \qquad (3)$$

In practice, over a wide range of load current, only the beginning section of the transition can develop before the opposite diode begins to conduct. That section can be approximated as a linear function of time:

$$v_{c1}(t) \approx V_{in} - t(I_m + I_p')/C_1. \qquad (4)$$

Figure 5:
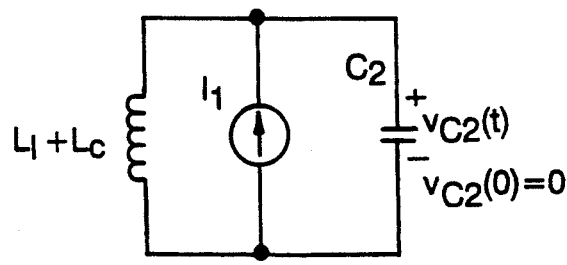
FIG. 5 shows the equivalent circuit for calculating the trailing leg transition.

2. Trailing-Leg (Passive-to-Active) Transitions: FIG. 5 shows the equivalent circuit used for determining the voltage transition process of the trailing leg. This equivalent circuit is simpler than that for the leading leg, because here the transformer is shorted-circuited by the forward-biased rectifier-diode bridge.

The current $I_1$ of the current source in the equivalent circuit is less than was the total current $I_m + I_p'$ for the leading-leg transition. The reason is that part of the energy stored in the inductances of the circuit at the beginning of the previous transition was lost during the transition process. $I_1$ can be calculated from the equation $$-C_1 dv_{c1}(t_1)/dt = I_1, \qquad (5)$$

where $t_1$ is the time needed to complete the voltage transition of the leading leg, i.e., to have the voltage across $C_1$ swing from $V_{in}$ to zero. $t_1$ can be determined from the following equation:

$$v_{c1}(t_1) = 0. \qquad (6)$$

For the practical case, where the energy stored in the circuit inductances is much larger than the energy change in capacitor $C_1$, we can use the approximation $I_1 \approx I_m + I_p'$ instead of the exact solution of (5).
The voltage across $C_2$ is $$v_{C2}(t) = I_1 \sqrt{\frac{L_1 + L_c}{C_2}} \sin \omega t, \qquad (7)$$

where $$\omega = \frac{1}{\sqrt{(L_1 + L_c)C_2}}$$

Unlike the case of the leading-leg transition, (7) usually cannot be approximated with a linear time function, even close to full load. The reason is that the total circuit inductance is much less than in the previous equivalent circuit, and so is the energy stored in it. The total energy is usually of the same order of magnitude as the charge in the storage energy of $C_2$ during the transition; therefore the linear approximation does not hold.

In order to achieve high efficiency in a dc/dc converter, low switching losses must be maintained over a wide range of operating conditions. In the soft-switching full-bridge converter, the turn-off losses can be reduced by faster gate turn-off and by having rubber capacitors in parallel with the switches. Turn-on losses result if the switches discharge partially charged capacitors $C_1$ or $C_2$. To ensure lossless transitions of the trailing leg, two conditions must be met: (1) the energy stored in the circuit inductances must be sufficient to swing the voltage of capacitors $C_1$ or $C_2$ all the way to the other power bus and (2) the switch must be turned "on" actively while current flows in its antiparallel diode. Because a full swing of the voltage of the leading leg can develop under any operating conditions, only condition #2 applies for the transitions of that leg.

The turn-on of the switch must be delayed by at least the leg-voltage transition time to meet condition #2. Below, we calculate the required turn-on delay for the three most-important cases: full load, shorted output, and zero load. In each case, we begin by determining the transition time.

1. Turn-on Delay at Full Load: At full load the linear approximation of the transition is usually valid. Thus the transition time is $$t_{tr,leading} = \frac{V_{in}C_1}{I_m + I_p'}. \qquad (8)$$

For lossless transition, the delay time $t_d$ must be larger than that given in (8). However, the delay time must not exceed the minimum duration of the passive state. From those two requirements, after eliminating $I_m$ and $I_p'$, the following bounds can be obtained for the delay time:

$$T\left(1 - \frac{V_o}{V_{in,min}N}\right) > t_{d,leading} > \quad (9)$$

$$\frac{V_{in,ext}C_1}{\frac{V_oT}{2L_mN} + \frac{V_oTN}{2L_o} - \frac{V_o^2T}{2V_{in,ext}L_o} + I_oN}$$

where $N = n_2/n_1$, $T$: clock period (half of the switch period),
$V_o$: output voltage,
$L_o$: output filter inductor,
$I_o$: load current,
$V_{in,min}$: minimum allowed value of $V_{in}$, and
$V_{in,ext}$: that value of the input voltage which maximizes the right-hand side of the inequality; depending on the particular parameter combinations, it is either the minimum or the maximum of $V_{in}$.

2. Turn-On Delay at Shorted Output: At shorted output, with pulse-by-pulse peak-current-limiting overload protection [4], the active state is always of short duration; therefore the magnetizing current is negligible. Also, if substantial foldback is used in the overload protection, the current in the circuit inductances may be so small that the linear approximation is no longer applicable.

From (1), the lower limit of the delay time is $$t_{d,leading} > \sqrt{L_t C_1} \; \arctan \frac{V_{in,max} \sqrt{C_1}}{I_o N L_t}, \quad (10)$$

where $L_t = L_1 + L_c + L_m \parallel \parallel L_o/N^2$.

The upper limit is equal to the duration of the passive state. At shorted output, it is easy to set the delay below that limit, because the duration of the passive state is only slightly shorter than the switch period $T$.

Figure 6:
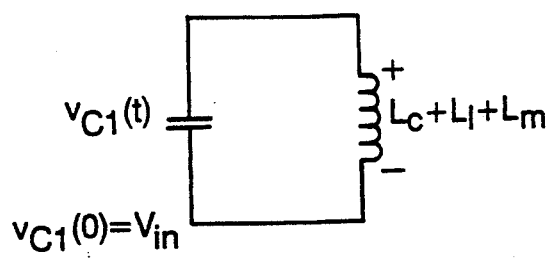
FIG. 6 shows the equivalent circuit for calculating the upper limit for the transition time of the leading leg

3. Turn-On Delay at Zero Load: At zero load, the duration of the active state approaches zero, and both the magnetizing current and the load current disappear. However, the output voltage remains at its nominal value. This means that the output filter inductor will not have much influence on the transition process. For this case, we can obtain an upper limit for the transition time from the simple equivalent circuit in FIG. 6. The minimum delay time for lossless transition must be larger than the maximum transition time, that is $$t_{d,leading,min} > t_{tr,leading,max} = \frac{\pi}{2} \sqrt{C_1(L_c + L_1 + L_m)}. \quad (11)$$

The minimum value for the delay time at zero load is usually much larger than that allowed from the minimum duration of the passive state. A practical compromise is to set the delay time according to (9) and to tolerate the turn-on switching losses at, or close to, zero load, where the conduction losses become negligible anyway. If those switching losses are not acceptable, they can be eliminated by additional inductors and capacitors (5).

The first condition for lossless transition is to have enough current in the leakage inductance $L_1$ and in the commutating inductance $L_c$ to swing the leg voltage all the way to the other power bus. The required minimum current is found from the energy equation as $$I_{1,min} = V_{in,max} \sqrt{C_2/(L_1 + L_c)}. \quad (12)$$

The second condition relates to the turn-on delay. The required minimum delay time is determined by the transition time needed for a full swing of the leg voltage. The maximum allowable delay time is determined by the time needed to return the total energy stored in the leakage and commutating inductances to the input power source.

Figure 7:
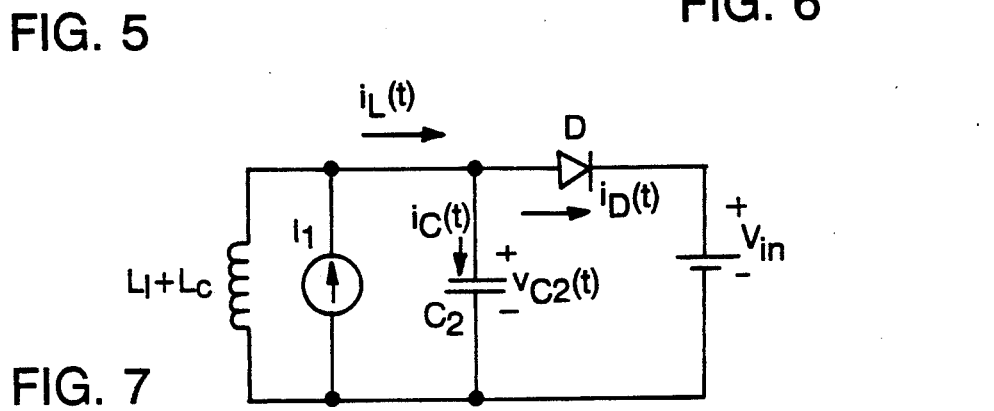
FIG. 7 shows the equivalent circuit for calculating the turn-on delay of the trailing leg.
Figure 8:
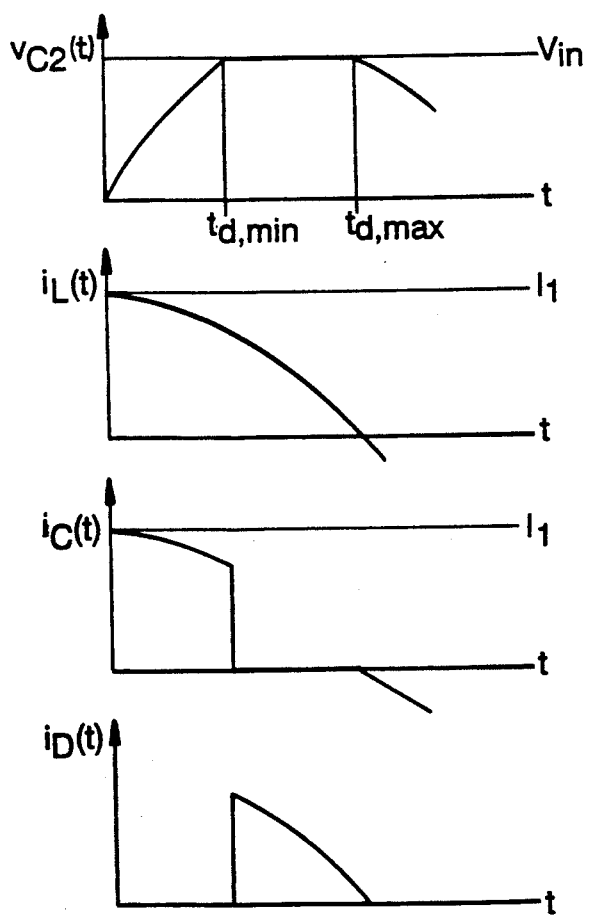
FIG. 8 shows waveforms in the circuit of FIG. 7.

The minimum and maximum values of the delay time can be calculated with the help of the equivalent circuit shown in FIG. 7. The circuit is the same as that in FIG. 5, with the addition of a diode which clamps the leg voltage at $V_{in}$. FIG. 8 shows the circuit waveforms.

The required minimum delay time is $$t_{d,trailing,min} = \sqrt{(L_1 + L_c)C_2} \; \arcsin \frac{V_{in,max}\sqrt{C_2}}{I_1\sqrt{(L_1 + L_c)}}. \quad (13)$$

The maximum allowable delay time is $$t_{d,trailing,max} = \sqrt{(L_1 + L_c)C_2} \; \arcsin \frac{V_{in,min}\sqrt{C_2}}{I_1\sqrt{(L_1 + L_c)}} + \quad (14)$$

$$\frac{I_1(L_1 + L_c)}{V_{in,min}} \cos \arcsin \frac{V_{in,min}\sqrt{C_2}}{I_1\sqrt{(L_1 + L_c)}}.$$

Figure 9:
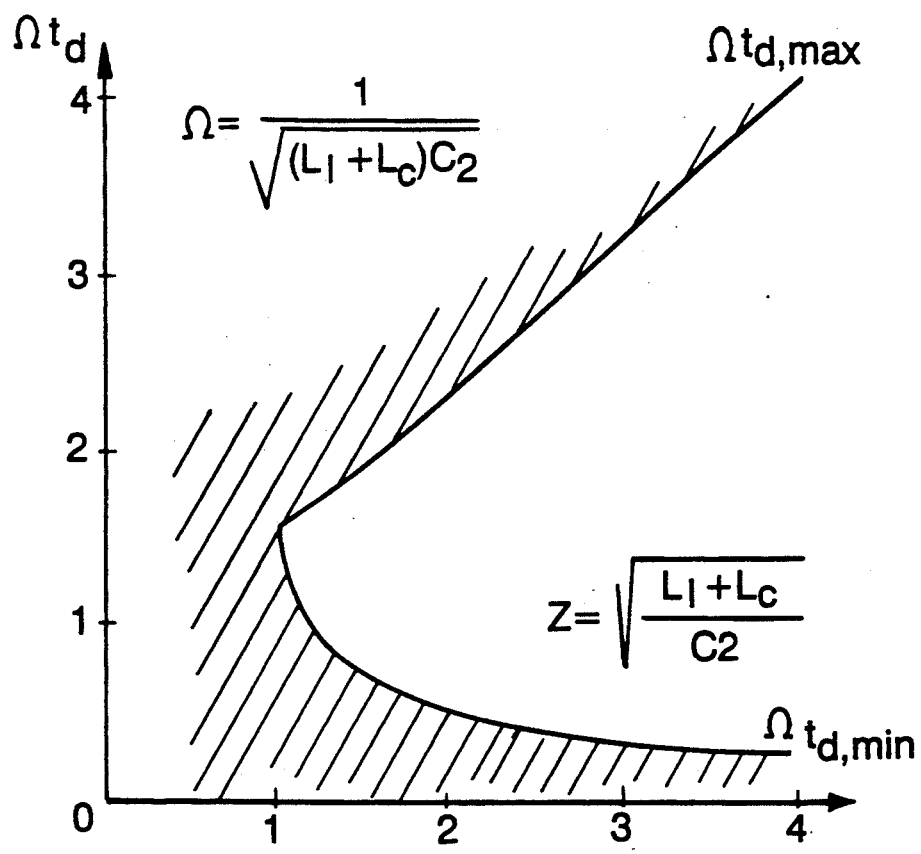
FIG. 9 shows the boundaries of turn-on delay for lossless transition of the trailing leg.

The normalized minimum and maximum delay times are plotted in FIG. 9 as functions of the normalized current. As can be seen, lossless transition of the trailing leg is not achievable below a certain minimum current, given by (12). Above that minimum current, lossless transition of the trailing leg is possible only if the delay time is between the two boundaries shown in FIG. 9. An optimum delay time can be inferred from FIG. 9. The optimum delay is that which produces lossless switching over the widest possible range of current, i.e., the delay time at the left edge of the area enclosed by the boundary curves in FIG. 9. The optimum delay time is independent of the input voltage. Its value is $$t_{d,trailing,opt} = \frac{\pi}{2} \sqrt{C_2(L_c + L_1)}. \quad (15)$$

Differences in the transition of the trailing leg at full load, at shorted output, and at zero load are due only to the different values of $I_1$.

1. $I_1$ at Full Load: The current is very nearly equal to that of the leading leg, i.e., $$I_1 \cong I_m + I_p'. \quad (16)$$

From elementary calculations $$I_m = V_o T/2L_m N, \quad (17)$$

and $$I_p' = N(I_o + V_o T/2L_o) = V_o^2 T/2V_{in}L_o. \quad (18)$$

2. $I_1$ at Shorted Output: In this case both the magnetizing current $I_m$ and the ac component of the current in the filter inductor are negligible. Thus $$I_1 = NI_o. \quad (19)$$

3. $I_1$ at Zero load: At zero load the only current available for swinging the voltage of the trailing leg is that previously developed during the transition of the leading leg. That current is $$I_1 = V_{in} \sqrt{C_1/(L_1 + L_c + L_m)}. \quad (20)$$

This current is usually much smaller than the required minimum for lossless transition given in (12). Although highly asymmetrical capacitance values for the snubber capacitors (i.e., $C_1 \gg C_2$) somewhat help the situation, it is still very difficult to ensure lossless transition at zero load. As a solution, the idea introduced in (5) can be used. Note, however, that the excess switching losses can probably be tolerated without extra heat-sinking capacity. The reason is that the reduction in the conduction losses is usually larger than the increase in the switching losses.

As is clear from (12), the minimum current for lossless transition of the trailing leg is inversely proportional to the square root of the source inductance (the sum of the leakage inductance and the inductance of the commutating inductor). Therefore, in order to maintain lossless transition at light load, it is desirable to have a large commutating inductor. Another side benefit of that inductor is that it reduces the reflected reverse peak current caused by the charge storage in the rectifier diodes As a first approximation, the reverse peak current is inversely proportional to the source inductance.

However, the inductive source impedance causes voltage overshoot during the decaying portion of the reverse current in the diodes. The magnitude of the overshoot depends on the rate of the current decay and also on the inductance. The rate of the current decay is determined by (1) the doping profile, (2) the recombination time constant, and (3) the charge distribution at the instant the diode ceases to support the externally forced reverse current. Increasing the source inductance will not help; in the practical range of commutating inductance values the current decay rate does not diminish fast enough to compensate for the increase in the inductance.

Figure 11:
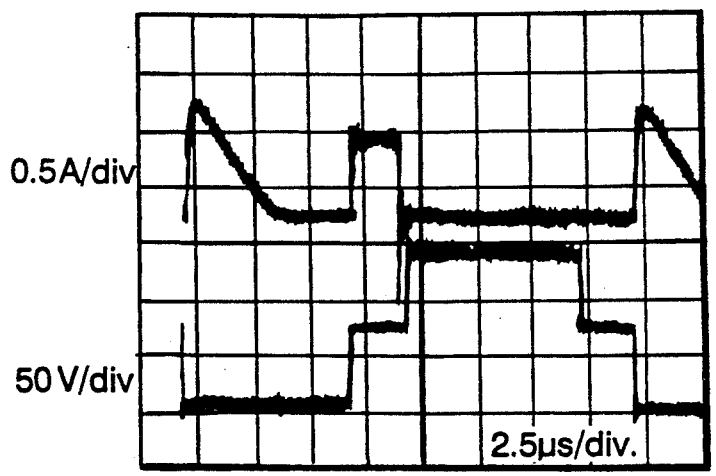
FIG. 11 shows current in a clamp diode in the upper trace and voltage across a secondary winding in the lower trace.

Due to the interaction between the junction capacitance and the source inductance, voltage overshoot and ringing will develop even with devices which do not have minority charge carrier storage (e.g., Schottky diodes). FIG. 11 of (1) illustrates this effect. That figure shows a ringing with 30-V amplitude on a nominal transformer secondary voltage of approximately 38 V. FIGS. 9 and 11 of (10) show waveforms of a circuit where high-voltage PN-junction diodes were used for rectification. In that circuit, a dissipative clamp limits the voltage overshoot across the rectifier diodes, but we can still observe a severe ringing. This is also not desirable because (1) the excess losses caused by the circulating current and the dissipation in the clamp circuit reduce the efficiency, and (2) the ringing might generate a spectral line in the radiated noise profile of the unit above the allowed EMI limit.

The voltage overshoot and ringing can generate excessive dynamic losses or unacceptable EMI. Failure of the fragile rectifier diodes can also occur. The overshoot and ringing can be controlled by methods listed in the introductory section of this paper (soft-recovery diodes, RC snubbers, or dissipative clamps) but none of those is a good cure to the problem. However, by selecting a large commutating inductance to leakage inductance ratio, we obtain an interesting solution: we can clamp the junction of the transformer and the commutating inductor to the supply rails with two diodes, as shown in FIG. 1. As a first approximation, the clamping will reduce the voltage overshoot in proportion to the ratio of those two inductances.

In the converter, rectifier diode turn-off occurs at each passive-to-active transition. During the passive state, both rectifier diodes conduct, although not evenly. The diode which was "on" during the previous active state will carry most of the load current. This can be explained as follows. The commutation of the current from the conducting diode to the other diode is hindered by the leakage inductances of the transformer and by the lack of sufficient voltage to force the commutation. In a bridge converter with traditional PWM control, in the passive state the diodes would share the current equally, except for a small difference due to the magnetizing current. By using phase-shifted PWM in a bridge converter, in the passive state the transformer primary is shorted out by two conducting switches. At the beginning of that state the full load current is carried by only one diode, and only a few hundred millivolts—the difference between the forward voltage drops of the diodes with close to full and close to zero current—are available for changing the current. Usually even the full duration of the passive state is not sufficient to change the currents noticeably.

Surprisingly, however, a small downward step can still be observed in the transformer primary current at the active-to-passive transition. The photo in FIG. 10, taken from a 1.5 kW converter, illustrates this observation. (The step can also be seen in FIG. 12d of (1).) The fundamental reason for that step is that the sum of the load current and the magnetizing current must charge up the various capacitances around the transformer. Those are: the junction capacitance of the nonconducting rectifier diode, the capacitance of the RC snubber (if any) across the same rectifier diode, and the different stray capacitances of the transformer. The total available charging current will be divided in two; the larger part will flow in capacitance $C_1$, the smaller part will flow in the capacitances around the transformer. The ratio of the two currents is proportional to the corresponding capacitances.

1. Currents in the Clamp Diode: The small difference between the transformer primary current and the current in the commutating inductor flows through one of the two clamp diodes. FIG. 11 shows the current in a clamp diode together with the voltage across a secondary winding of the transformer.

The clamp diode carries current not only during the passive state. As can be seen in FIG. 11, a slowly decaying current pulse flows through the diode at the beginning of the active state. The origin of that current pulse is the following. Due to charge storage in the rectifier diode and various capacitances around the transformer and the rectifier an excess current develops in the commutating inductor during the passive-to-active transition. The excess current is the sum of the reverse peak current of that rectifier which is turned "off" during the transition plus the current needed to charge up the transformer, junction, and snubber capacitances. The excess current is carried by the clamp diode connected to the same power rail as the then conducting switch of the trailing leg. The current pulse decays to zero with a slope equal to the slope of the primary current of the transformer (i.e., the sum of the slope of the magnetizing current and the reflected filter inductor current).

2. Switching losses in the Clamp Diode: A clamp diode turns "off" twice in each clock period. The first turn-off which happens during the active state is virtually lossless because of the slow decay rate of the current. The second turn-off takes place at the end of the passive state. Here the rate of decay of the current is much larger, approximately $V_{in}/(L_c+L_1)$. Considerable switching loss is expected in the diode at this turn-off.

Figure 12:
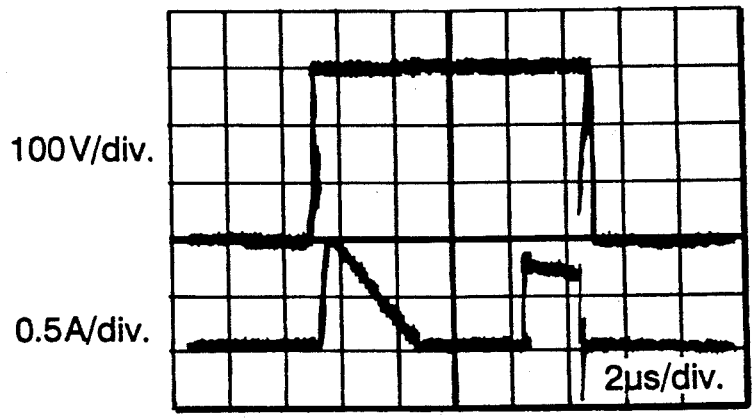
FIG. 12 shows the voltage across a clamp diode in the upper trace and the current in the same clamp diode in the lower trace.

The diode voltage and current are shown in FIG. 12.

In order to reduce the switching loss, we must use a fast clamp diode. Also, the magnitude of the current should be kept at minimum. This can be achieved by (1) using the minimum amount of snubber capacitances, (2) selecting low-capacitance rectifiers, and (3) employing low-capacitance winding technique for the transformer. However, except for the snubber capacitances, the other capacitive components cannot be reduced significantly. If the switching loss becomes a problem, a small RC snubber from the junction of the clamp diodes to ground or to the other end of the commutating inductor might provide a solution. Note that in the 1.5 kW converter 1-A diodes were used with good results without extra snubbers or heat sinking.

Both voltage-mode and current-mode control can be used in the converter. With voltage-mode control, however, the problem of transformer volt-second unbalance appears (6). Although it is possible to eliminate the static unbalance w a coupling capacitor connected in series with the primary winding (1), (3), (9), (10), it is better to use current-mode control with its many side benefits, including automatic volt-second balance (6) without a series capacitor. ([2] describes a practical example with current-mode control.) In our design we used current-mode control, too. Aside from some minor details, the design and compensation of the feedback system is not different from that for a traditional bridge converter, therefore we shall not discuss it here. However, the location of the current sensor is important.

Figure 13:
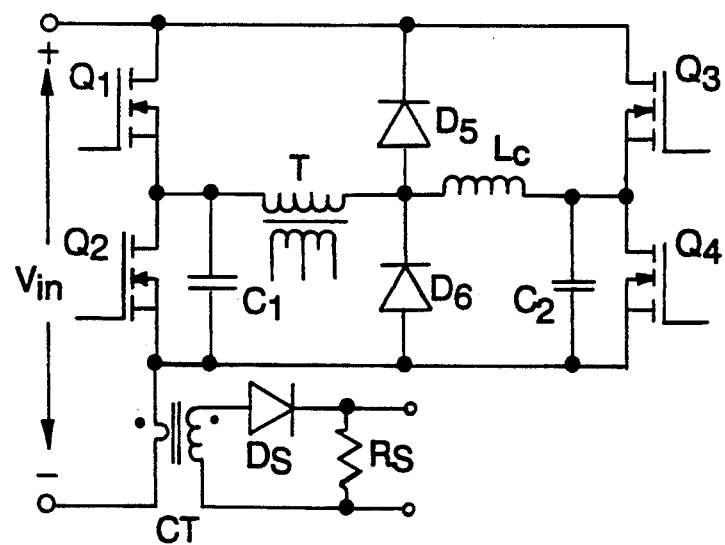
FIG. 13 shows a suitable location of the currentsense transformer.

1. Location of the Current Sensor: The current cannot be sensed with a current transformer in series with the primary winding of the transformer. The reason is that a circulating dc current can develop in the primary circuit which can cause saturation of the power transformer and/or the current transformer and can prevent the normal operation. That circulating dc current cannot be detected by a current transformer. [2] recommends that two current transformer be used in series with the two switches of the trailing leg. This is a workable solution, but a single current transformer is sufficient if located properly. We place the current-sense transformer in series with one of the power rails, e.g., the negative rail, as shown in FIG. 13. The only condition for the proper operation of this scheme is that the passive state be long enough that the current transformer be able to reset during that state. Note that a sense resistor can also be used in place of the current transformer if loss or noise considerations allow it. That solution works even at zero duration of the passive state. Note further that in case of a true dc current sensor which can detect signals of both positive and negative polarity (e.g., a Hall sensor), placing the sensor in series with the primary winding of the transformer is acceptable.

[7] gives details of a computer-aided study for voltage-mode control and for two different kinds of current-mode control for the converter. The two kinds of current-mode control differ in the origin of the current signal. In one case, the current signal originates from the primary current, in the other case it originates from the filter inductor current. Unfortunately, the study fails to note that primary current sensing does not work in a converter with capacitively coupled power transformer (the one studied in that paper) unless special measures are applied to prevent the voltage runaway across the coupling capacitor [8]. Sensing the output filter inductor is acceptable but it has some drawbacks: (1) the coupling capacitor is definitely required because there is no direct control over the circulating current in the primary circuit, (2) there is no protection against transformer saturation caused by temporary volt-second unbalance (e.g., triggered by a load transient), and (3) the magnetizing current cannot be used as compensating ramp (needed at constant-frequency current-mode control to avoid subharmonic instability).

Figure 14:
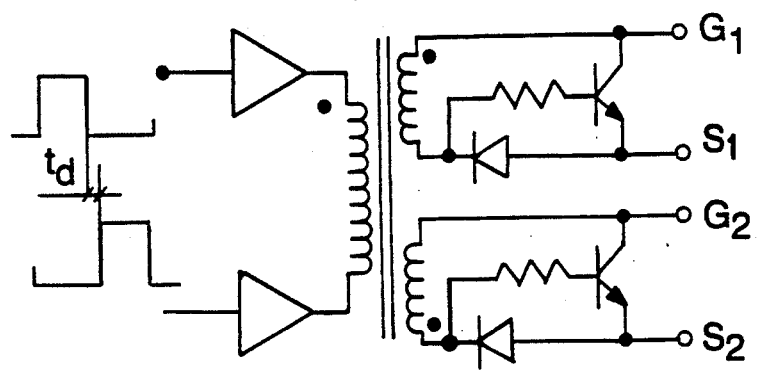
FIG. 14 shows a gate-drive circuit.
Figure 15A:
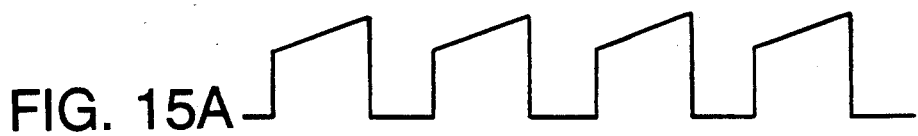
FIG. 15A-15E shows fundamental waveforms of the control circuit.
Figure 15B:
Figure 15C:
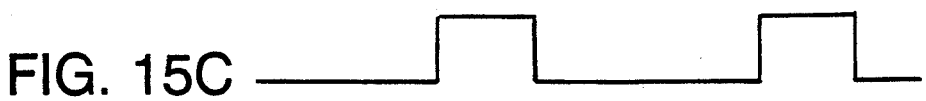
Figure 15D:
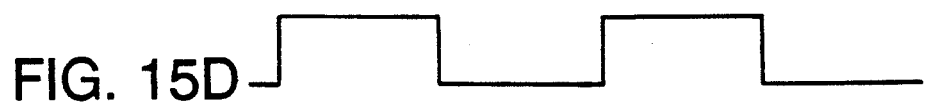
Figure 15E:
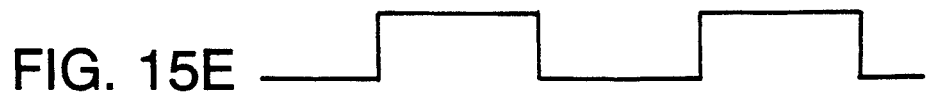

FIG. 14 shows the gate-drive circuit used in our 1.5 kW converter. The circuit provides drive signal for two MOSFET switches in one leg. Its operation is as follows. The control circuit generates two signals each of which has somewhat less than 50% duty ratio. The falling edge of one of the signals is followed by the leading edge of the other signal with a delay $t_d$ necessary for lossless transition. The two signals drive two buffer stages (in our case two channels of a TSC427 IC), which in turn drive a transformer with two secondary windings. One of the two MOSFET switches is turned "on" through a forward-biased diode connected in series with a secondary winding. Then, during the delay time, the outputs of both buffers are at ground, and the transformer is effectively shorted. In this state both MOSFETs are kept "off" by the npn transistors. The sequence repeats for the other switch at the arrival of the next positive-going edge of the control signal.

This drive is simple, it provides fast turn-off, and it does not reverse-bias the gates unnecessarily. This reduces the dissipation for the buffer stages to half of the dissipation of a drive with the same gate-voltage swing in the positive and negative directions.

At the time this equipment was developed, no IC controller was available for generating the phase-shifted PWM signal with current-mode control. We used a push-pull current-mode-control chip (UC3846) with additional logic gates and RC delay members to generate the four control signals for the gate drive circuits.

FIG. 15 shows the fundamental waveforms of the control circuit. A is the sensed current signal, B is one output signal of the push-pull control IC, C is the other output signal of the control IC, D is a control signal for the first gate drive circuit (for the trailing leg), E is a control signal for the second gate drive circuit (for the leading leg). The signals D and E must be processed further (they must be inverted and passed through delay-time setting circuits) before they can be actually used for controlling the gate drivers.

As can be seen from the waveforms, the two rising edges or the two falling edges of the output signals from the control IC define the two basic control signals for the two legs of the converter. Those control signals stay at a low or high value if the IC is disabled by the housekeeping circuitry during start-up, turn-off, or fault. Also, during load transients, the duty ratio of signal E can deviate temporarily from 50%. All those events can cause saturation of the drive transformer. The saturation of the drive transformer is undesirable because it can lead to failure of the buffer stages and/or it can generate ringing which might turn "on" both switches in a leg simultaneously, with catastrophic consequences.

A simple "watchdog" circuit will prevent the drive-transformer saturation. That circuit comprises a retriggerable monostable multivibrator which is triggered by the edges of signal E, plus four gates. The gates let the four control signals through when the output of the multivibrator is "high," otherwise they inhibit the path. The timing of the multivibrator is set somewhat above the clock period. If the time elapsed between two successive edges exceeds the set timing of the multivibrator, the control signals are inhibited and the drive transformer is shorted. Thus, transformer saturation becomes impossible.

A converter with 1.5 kW output power (60 V, 25 A), operating from a regulated 370-V source (the output of a unity-power-factor boost converter operating from a 230-Vac power mains) was built and tested. The parameters of the circuit (shown in FIG. 1) are:

| | |
|---|---|
| $Q_1$–$Q_4$: | IRFP460 each, |
| $D_7$, $D_8$: | BYV72 each, two diodes in a package paralleled, 68 Ω in series with 2.2 nF across each pair of paralleled diodes, |
| $D_5$, $D_6$: | MUR150 each, |
| $n_1 = 20$ turns, $n_2 = 4$ turns, $L_m = 3$ mH, $L_1 = 3$ µH, transformer core: E70, N27, | |
| $L_c = 15$ µH, | |
| $L_o = 70$ µH, | |
| $C_1$: $2 \times 270$ pF + $2 \times C_{oss}$ of the IRFP460 MOSFET switch, | |
| $C_2$: $2 \times C_{oss}$ of the IRFP460 MOSFET switch, | |
| clock period: 10 µs, switch period: 20 µs. | |

Figure 10:
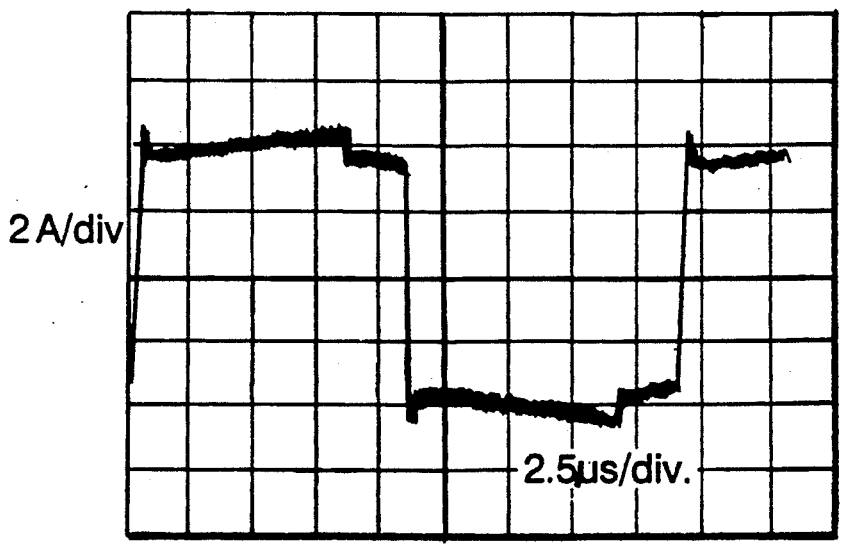
FIG. 10 shows transformer primary current in a 1.5 kW converter.

FIGS. 10 to 12 showed some of the waveforms of the converter; FIGS. 16 to 24 show more waveforms.

Figure 16:
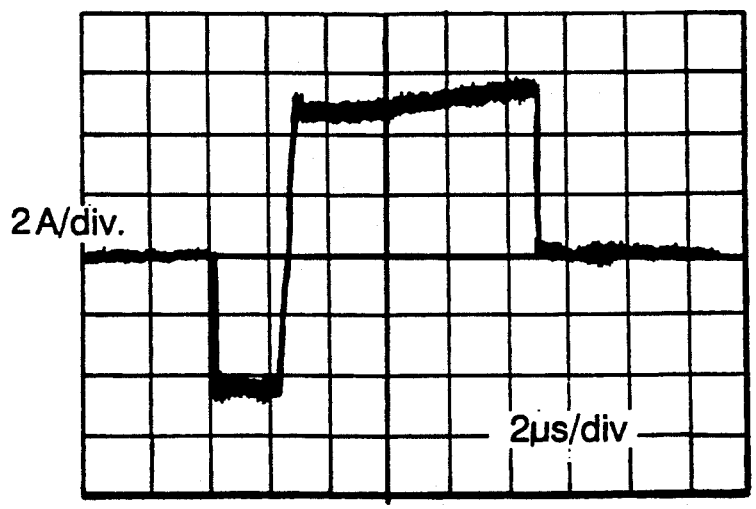
FIG. 16 shows the current in the switch of the leading leg.
Figure 17:
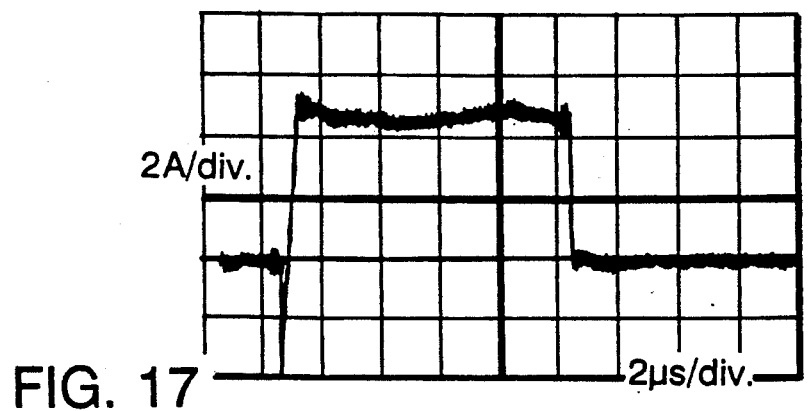
FIG. 17 shows current in the switch of the trailing leg.
Figure 18:
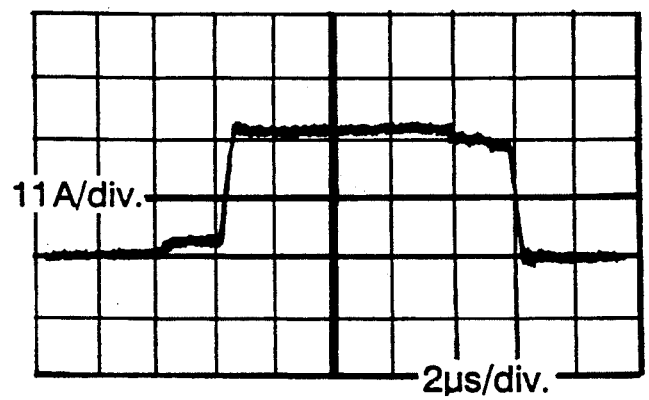
FIG. 18 shows current in the rectifier diode.

FIGS. 16 to 18 present the currents in a switch of the leading leg and the trailing leg, and in a rectifier diode. As is clearly visible, the rates of transitions of the leading edges of the switch currents and both edges of the rectifier current are well controlled, thanks to the presence of the commutating inductor. Although at the time this paper was written no EMI measurements were completed, we expect little difficulty in meeting the usual requirements.

Figure 19:
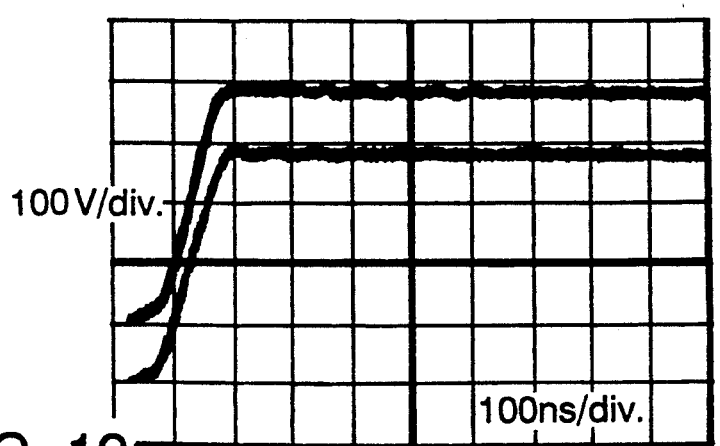
FIG. 19 shows leg-voltage transitions in the converter with upper and lower traces showing trailing and leading legs, respectively.
Figure 20:
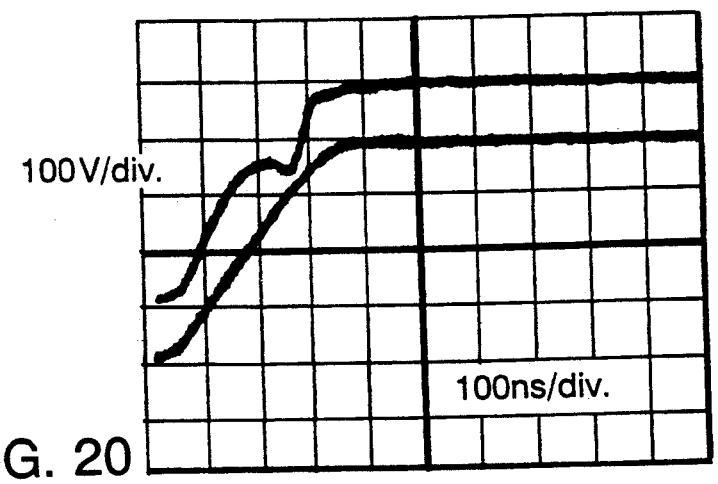
FIG. 20 shows leg-voltage transitions in the converter with upper and lower traces showing trailing and leading legs, respectively.

FIGS. 19 and 20 show the transitions of the leg voltages at 80% load current and at 25% load current. Both transitions are lossless at 80% load (FIG. 19), and the transition times are about 100 ns. At 25% load (FIG. 20) the transition times slow down to about 300 ns. The leading-leg transition remains lossless. The trailing leg cannot swing all the way to the other power rail, but the estimated loss due to the discharge of $C_2$ by $Q_3$ is still negligible (less than 0.1% of the full load).

Figure 21:
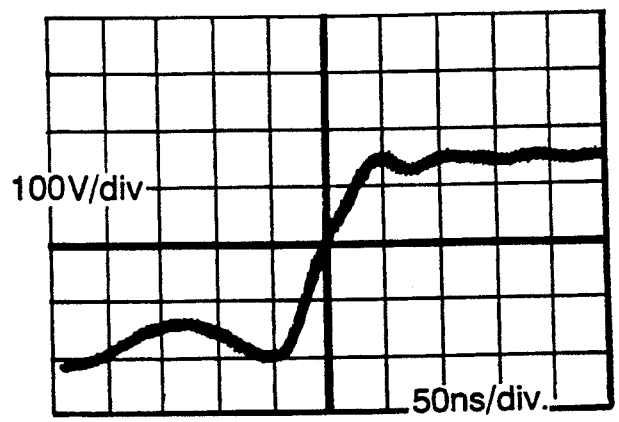
FIG. 21 shows the transition of the trailing leg with commutating inductor shorted-out.

To illustrate the beneficial effect of the commutating inductor, FIG. 21 shows the voltage transition at the trailing leg with the inductor removed by connecting a short-circuit across it. The load current was 12.5 A in this test. Without the inductor in the circuit, the leg voltage swings up to only 60 V and then swings back to zero. Then the switch charges the leg capacitance through the entire voltage transition of 370 V; the transition is lossy. The transition loss amounts to about 0.5% of full load, a significant amount in a circuit with more than 95% efficiency.

Figure 22:
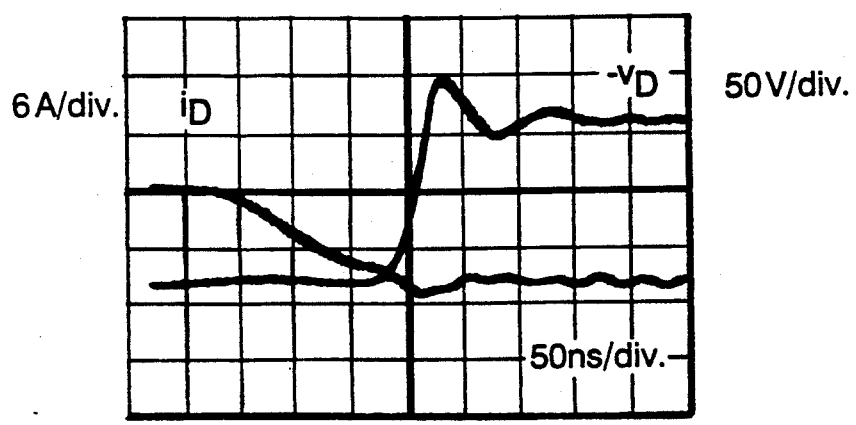
FIG. 22 shows rectifier current and reverse voltage at turn-off with the commutating inductor shorted.
Figure 23:
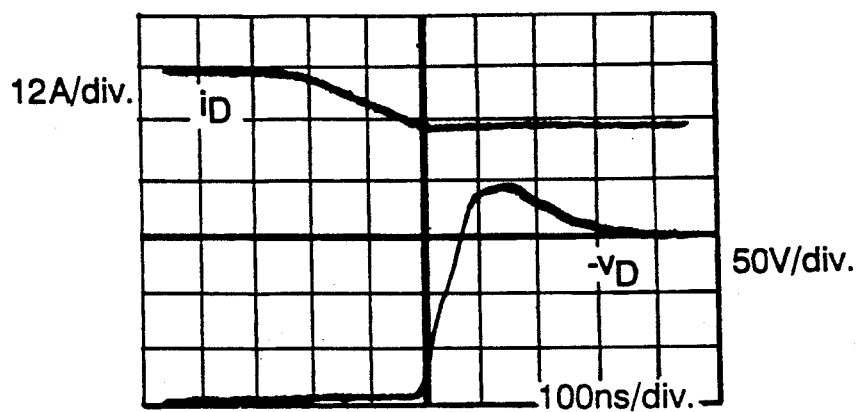
FIG. 23 shows rectifier current in the upper trace and reverse voltage in the lower trace at turn-off with the clamp diodes removed.
Figure 24:
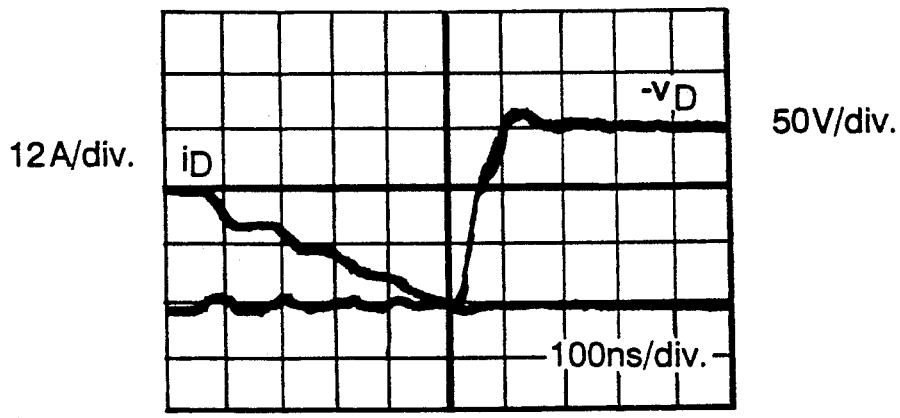
FIG. 24 shows rectifier current and reverse voltage at current-off.

FIGS. 22 to 24 show the effect of the commutating inductor and the clamp diodes on the waveforms of the rectifier diodes. FIG. 22 shows the voltage across the diode with the commutating inductor short-circuited, with 50% load. As the photo illustrates, the transition of the diode voltage is very abrupt, and the voltage overshoots above the plateau by about 40 V. The commutating inductor is in circuit arrangement for helping soft-switching of the semiconductor switching devices and reducing the ringing and overshoot across each output rectifier.

In FIG. 23, the short is removed from the commutating inductor, but the clamp diodes are also removed. The load is 50%. Here the transition is well controlled, but the voltage overshoots by about 45 V. At last in FIG. 24 both the commutating inductor and the clamp diodes are present. Here the load is twice as much as before (25 A, that is 100%) but the overshoot is only about 15 V. Also the transition is well controlled.

Figure 25:
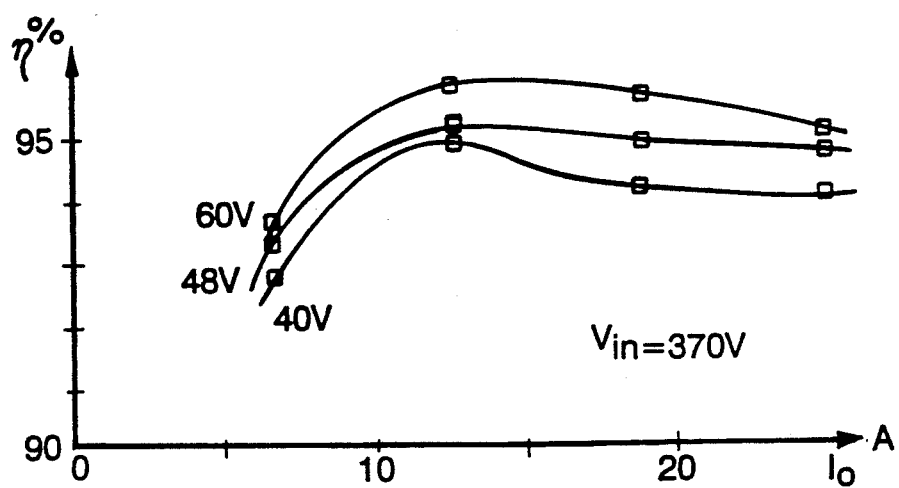
FIG. 25 shows the measured drain efficiency of the converter.

FIG. 25 shows the measured drain efficiency of the converter at output voltages of 40 V, 48 V, 60 V, as a function of the output current. From 50% to 100% load, the efficiency stays above 94% even at 40-V output, and is between 95 and 96% at 60-V output. The measured figures do not include the power consumption of the control, drive, and housekeeping circuits—about 100 mA from 14 V; that power consumption is less than 0.1% of the full-load input power.

There has been described an improved soft-switching full-bridge converter which is especially suitable for high-power applications (e.g., more than 1 kW output) because of its inherently high efficiency. At these power levels, the expense of four controlled switches is justifiable. The addition of a small commutating inductor and two low-current clamp diodes essentially eliminates the dynamic losses and the overshoot and ringing of the rectifier diodes associated with their charge storage and junction capacitances. The commutating inductance also helps to ensure lossless transition of the trailing leg of the converter, without requiring excessive magnetizing current in the transformer. We analyzed the conditions for lossless transitions, discussed the effect of the added components on the operation of the converter, and presented practical considerations and test results for a 1.5 kW converter with 100-kHz clock frequency. The converter has an efficiency above 95% at 60-V output, it is free from voltage overshoots, and it exhibits well-controlled transitions for all switch and rectifier voltages and currents.

REFERENCES

[1] R. A. Fisher, K. D. T. Ngo, and M. H. Kuo, "A 500 kHz, 250 W dc-dc converter with multiple outputs controlled by phase-shifted PWM and magnetic amplifiers," Proc. High Frequency Power Conversion Conference, May 1988, pp. 100–110.

[2[ M. M. Waltes, W. M. Polivka, "high-density modular power processor for distributed military power systems," Proc. APEC '89 (IEEE Catalog No. 89CH2719-3), pp. 403–412.

[3] L. H. Mweene, C. A. Wright, and M. S. Schlecht, "A 1 kW, 500 kHz front-end converter for a distributed power supply system," Proc. APEC '89 (IEEE Catalog No. 89CH2719-3), pp. 423–432.

[4] R. Redl, N. O. Sokal, "Overload-protection methods for switching-mode dc/dc converters: classification, analysis, and improvements," PESC '87 Record, IEEE Catalog No. 87CH2459-6, pp. 107–118.

[5] O. D. Patterson, D. M. Divan, "Pseudo-resonant full bridge dc/dc converter," PESC '87 Record, IEEE Catalog No. 87CH2459-6, pp. 424–430.

[6] R. Redl., M. Domb, and N. O. Sokal, "How to predict and limit volt-second unbalance in voltage-fed push-pull power converters," Proc. of the Sixth International Power Conversion Conference (PCI), Orlando, Fla., April, 1983, pp. 314–330.

[7] G. W. Ludwig, G. A. Franz, "Control study of a 500 kHz, 250 W dc-dc converter," Proc. APEC '89 (IEEE Catalog No. 87CH2719-3), pp. 433–438.

[8] R. Redl, N. O. Sokal, "How to use current-mode control with capacitively coupled half-bridge converters," Proc. APEC '87 (IEEE Catalog No. 87CH2402-6), pp. 257–265.

[9] D. B. Dalal, "A 500-kHz multi-output converter with zero voltage switching," Proc. APEC '90 (IEEE Catalog No. CH2853-0/90/0000-0265), pp. 265–274.

[10] J. A. Sabaté, V. Vlatkovic, R. B. Ridley, F. C. Lee, and B. H. Cho, "Design considerations for high-voltage highpower full-bridge zero-voltage-switching PWM converter," Proc. APEC '90 (IEEE Catalog No. CH2853-0/90/0000-0265), pp. 275–284.

There is attached as Appendix A a paper entitled A NOVEL SOFT-SWITCHING FULL-BRIDGE DC/DC CONVERTER: ANALYSIS DESIGN CONSIDERATION, AND EXPERIMENTAL RESULTS AT 1.5 kW, 100 kHz

What is claimed is:

1. In a phase-shifted pulse-width-modulated soft-switching full-bridge dc/dc converter having first and second power-supply rails intercoupled by semiconductor switching devices characterized by switching losses and exchanging energy through a transformer coupled to at least one output rectifier and characterized by leakage inductance with the full-bridge dc/dc converter controlled by a phase-shifted pulse-width modulator, the improvement comprising, an external commutating inductor connected to said transformer at a junction and characterized by commutating inductance significantly larger than said leakage inductance in circuit arrangement for helping soft-switching of the semiconductor switching devices and reducing the ringing and overshoot across each output rectifier, and first and second clamp diodes connected respectively from said first and second power-supply rails to said junction coupled to said converter, for reducing said switching losses of said semiconductor switching devices and for reducing the reverse-voltage ringing and overshoot across each output rectifier.

* * * * *

UNITED STATES PATENT AND TRADEMARK OFFICE
CERTIFICATE OF CORRECTION

PATENT NO.    : 5,198,969
DATED         : March 30, 1993
INVENTOR(S)   : Richard Redl et al.

It is certified that error appears in the above-identified patent and that said Letters Patent is hereby corrected as shown below:

Column 1,
Line 33, after "ringing" should be -- . --.

Column 3,
Line 27, "vci (t)" should be -- $v_{c1}(t)$ --.

Column 4,
Line 38, "rubber" should be -- snubber --.

Column 6,
Line 57, "$I_1 \leq$" should be -- $I_1 =$ --.

Column 7,
Line 31, after "diodes" should be -- . --.

Column 9,
Line 33, "w" should be -- with --.

Signed and Sealed this

Twelfth Day of February, 2002

Attest:

JAMES E. ROGAN
Attesting Officer    Director of the United States Patent and Trademark Office